(12) United States Patent
Shi et al.

(10) Patent No.: US 12,091,581 B2
(45) Date of Patent: Sep. 17, 2024

(54) HIGH OXIDE FILM REMOVAL RATE SHALLOW TRENCH (STI) CHEMICAL MECHANICAL PLANARIZATION (CMP) POLISHING

(71) Applicant: Versum Materials US, LLC, Tempe, AZ (US)

(72) Inventors: Xiaobo Shi, Chandler, AZ (US); Krishna P. Murella, Phoenix, AZ (US); Joseph D. Rose, Gilbert, AZ (US); Hongjun Zhou, Chandler, AZ (US); Mark Leonard O'Neill, Queen Creek, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 235 days.

(21) Appl. No.: 17/756,514

(22) PCT Filed: Dec. 2, 2020

(86) PCT No.: PCT/US2020/062783
§ 371 (c)(1),
(2) Date: May 26, 2022

(87) PCT Pub. No.: WO2021/113285
PCT Pub. Date: Jun. 10, 2021

(65) Prior Publication Data
US 2023/0020073 A1    Jan. 19, 2023

Related U.S. Application Data

(60) Provisional application No. 62/943,314, filed on Dec. 4, 2019.

(51) Int. Cl.
*C09G 1/02*     (2006.01)
*B24B 37/04*    (2012.01)
(Continued)

(52) U.S. Cl.
CPC .............. *C09G 1/02* (2013.01); *B24B 37/044* (2013.01); *C09K 3/1436* (2013.01); *H01L 21/31053* (2013.01)

(58) Field of Classification Search
None
See application file for complete search history.

(56) References Cited

U.S. PATENT DOCUMENTS

| 5,876,490 | A  | 3/1999 | Ronay |
| 6,544,892 | B2 | 4/2003 | Srinivasan et al. |

(Continued)

FOREIGN PATENT DOCUMENTS

| CN | 10555589 A  | 5/2016 |
| CN | 106244021 A | 12/2016 |

(Continued)

OTHER PUBLICATIONS

The China National Intellectual Property Administration; Patent Search Report; Application No. 2020800927105; Feb. 16, 2023.

(Continued)

*Primary Examiner* — Allan W. Olsen
(74) *Attorney, Agent, or Firm* — Lina Yang (57) ABSTRACT

High oxide film removal rate Shallow Trench Isolation (STI) chemical mechanical planarization (CMP) polishing compositions, methods, and systems of use therefore are provided. The CMP polishing composition comprises abrasives of ceria coated inorganic oxide particles, such as ceria-coated silica; and a chemical additive for providing a high oxide film removal rate. The chemical additive is a gelatin molecule possessing negative and positive charges on the same molecule.

6 Claims, 3 Drawing Sheets

(51) Int. Cl.
*C09K 3/14* (2006.01)
*H01L 21/3105* (2006.01)

(56) References Cited

U.S. PATENT DOCUMENTS

| | | |
|---|---|---|
| 6,616,514 B1 | 9/2003 | Edelbach et al. |
| 6,914,001 B2 | 7/2005 | Lee et al. |
| 6,964,923 B1 | 11/2005 | Ronay |
| 6,984,588 B2 | 1/2006 | Grove et al. |
| 7,247,082 B2 | 7/2007 | Yoshida et al. |
| 8,778,203 B2 | 7/2014 | Dandu et al. |
| 2002/0039875 A1 | 4/2002 | Kobayashi et al. |
| 2010/0081281 A1 | 4/2010 | Babu et al. |
| 2011/0250754 A1* | 10/2011 | Hirano .............. H01L 21/02074 438/693 |
| 2012/0021675 A1* | 1/2012 | Matsui ...................... B24B 1/00 451/36 |
| 2012/0077419 A1 | 3/2012 | Zhang et al. |
| 2013/0280910 A1 | 10/2013 | Ihnfeldt |
| 2014/0295738 A1* | 10/2014 | Matsui ...................... C09G 1/02 451/41 |
| 2016/0160083 A1 | 6/2016 | Lauter et al. |
| 2016/0257856 A1 | 9/2016 | Reiss et al. |
| 2016/0358790 A1 | 12/2016 | Shi et al. |
| 2017/0088748 A1* | 3/2017 | Stender .................... C09G 1/04 |
| 2017/0133236 A1 | 5/2017 | Murella et al. |
| 2017/0362466 A1* | 12/2017 | Shi ...................... H01L 21/3212 |
| 2019/0127607 A1 | 5/2019 | Rose et al. |
| 2021/0009859 A1* | 1/2021 | Kim ..................... C09K 3/1463 |

FOREIGN PATENT DOCUMENTS

| | | |
|---|---|---|
| CN | 107109136 A | 8/2017 |
| CN | 107427988 A | 12/2017 |
| EP | 3686257 A1 | 7/2020 |
| JP | 2008244316 A | 10/2008 |
| TW | 201043686 A | 12/2010 |
| WO | 2006001558 A1 | 1/2006 |

OTHER PUBLICATIONS

The China National Intellectual Property Administration; Patent Search Report; Application No. 2020800927105; Sep. 25, 2023.

* cited by examiner

HIGH OXIDE FILM REMOVAL RATE SHALLOW TRENCH (STI) CHEMICAL MECHANICAL PLANARIZATION (CMP) POLISHING

CROSS REFERENCE TO RELATED PATENT APPLICATIONS

The application claims the benefit of U.S. application Ser. No. 62/943,314 filed on Dec. 4, 2019. The disclosure of application Ser. No. 62/943,314 is hereby incorporated by reference.

BACKGROUND OF THE INVENTION

This invention relates to Shallow Trench Isolation (STI) chemical mechanical planarization (CMP) compositions, methods, and systems having high oxide film removal rate for Shallow Trench Isolation (STI) process.

In the fabrication of microelectronics devices, an important step involved is polishing, especially surfaces for chemical-mechanical polishing for recovering a selected material and/or planarizing the structure.

In the global planarization of patterned STI structures, to fast remove the bulk capping layers of oxide films, such as tetraethyl orthosilicate (TEOS) and High Density Deposition Chemical Vapor Deposition (CVD) or HDP films, is a key requirement for the high through put STI CMP process in 3D NAND, interlayer dielectric (ILD), and STI CMP processes.

U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876,490. Ceria, alumina, silica & zirconia are used as abrasives. Molecular weight for such listed polyelectrolyte is from 300 to 20,000, but in overall, <100,000.

U.S. Pat. No. 6,616,514 discloses a chemical mechanical planarization polishing slurry for use in removing a first substance from a surface of an article in preference to silicon nitride by chemical mechanical planarization polishing. The chemical mechanical planarization polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium.

U.S. Pat. No. 6,984,588 discloses a pulverized ceria slurry in order to evaluate its ability to polish blanket silicon dioxide and nitride wafers. Rhodite grade 400HS ceria, having particle sizes approximately 2-4 μm was purchased from Universal Photonics, Hicksville, N.Y. and pulverized using an agitator bead mill to a primary median particle size of 150 nm. Pulverizing was accomplished under wet conditions so that the resulting slurry, pH approximately 7.5 to 8.5, contained 20% to 30% solids after the pulverizing process.

U.S. Pat. No. 6,544,892 discloses a method of removing silicon dioxide in preference to silicon nitride from a surface of an article by chemical-mechanical polishing comprising of polishing said surface using a polishing pad, water, abrasive particles, and an organic compound having both a carboxylic acid functional group and a second functional group selected from amines and halides.

U.S. Pat. No. 7,247,082 discloses a polishing composition comprising an abrasive, a pH adjusting agent, an improver of a selective ratio, and water, wherein the abrasive is contained in an amount of from 0.5 to 30% by weight, the pH adjusting agent is contained in an amount of from 0.01 to 3% by weight, the improver of a selective ratio is contained in an amount of 0.3 to 30% by weight, and water is contained in an amount of 45 to 99.49% by weight, wherein the weight % is based on the weight of the polishing composition, and wherein the improver is one or more compounds selected from the group consisting of methylamine, ethylamine, propylamine, isopropyl amine, dimethylamine, diethylamine, dipropylamine, diisopropylamine, ethylenediamine, 1,2-diaminopropane, 1,3-propanediamine, 1,4-butanediamine, hexamethylenediamine, N,N,N',N'-tetramethyl-1,6-diaminohexane, 6-(dimethylamino)-1-hexanol, bis(3-aminopropyl)amine, triethylenetetraamine, diethylene glycol bis(3-aminopropyl) ether, piperazine, and piperidine." (NOTE: There are four slurry claims. Claim: The polishing composition according to claim 1, wherein the improver is one or more compounds selected from the group consisting of propylamine, isopropylamine, N,N,N',N'-tetramethyl-1,6-diaminohexane, 6-(dimethylamino)-1-hexanol, bis(3-aminopropyl)amine, triethylenetetraamine, diethylene glycol bis(3-aminopropyl) ether, and piperazine. Claimed abrasive is colloidal silica or fumed silica or mixtures.

U.S. Pat. No. 8,778,203 discloses a method for selectively removing a target material on a surface of a substrate, the method comprising the steps of: providing a substrate comprising a target material and a non-target material; dissolving oxygen in a polishing solution to achieve a pre-determined dissolved oxygen concentration, the polishing solution having a pH of from about 5 to about 11, wherein the polishing solution comprises a plurality of abrasive silica particles, at least some of said plurality of abrasive silica particles are functionalized with n-(trimethoxysilylpropyl)isothiouronium chloride; maintaining, by continuously applying substantially pure oxygen to said polishing solution, the pre-determined dissolved oxygen concentration of said polishing solution at or between approximately 8.6 mg/L and approximately 16.6 mg/L; disposing the polishing solution between a polishing pad and the surface; applying the polishing pad to the surface; and selectively removing a predetermined thickness of the target material; wherein varying the dissolved oxygen content of the polishing solution varies the removal ratio of target material to non-target material during the removal step.

U.S. Pat. No. 6,914,001 discloses s chemical mechanical polishing method comprising: contacting a surface of a semiconductor wafer with a surface of a polishing pad; supplying an aqueous solution containing abrasive particles, a removal rate accelerator, and different first and second passivation agents to an interface between the surface of the polishing pad and the surface of the semiconductor wafer, wherein the first passivation agent is an anionic, cationic or nonionic surfactant; and, rotating the surface of the semiconductor wafer relative to the surface of the polishing pad to remove an oxide material on the semiconductor wafer.

However, there is still a strong demand for STI CMP slurries which can provide high oxide and dielectric film removal rates with the use of relative low abrasive concentrations and suitable new chemical additives which are able to boost oxide film removal rates.

Therefore, it should be readily apparent from the foregoing that there remains a need within the art for compositions, methods, and systems of STI chemical mechanical planarization polishing that can afford the high oxide film removal rates in a STI chemical mechanical planarization (CMP) process.

SUMMARY OF THE INVENTION

The present invention provides STI CMP polishing compositions, methods, and systems for achieving high oxide film removal rates and its related CMP polishing methods.

The disclosed chemical mechanical planarization (CMP) polishing compositions for Shallow Trench Isolation (STI) CMP applications have a unique combination of using ceria-coated inorganic oxide abrasive particles and a gelatin molecule possessing negative and positive charges on the same molecule and is made from natural sources or from synthetic chemistry as an suitable chemical additive to boost oxide film removal rates.

In one aspect, there is provided a STI CMP polishing composition comprises:
ceria-coated inorganic oxide particles;
a gelatin molecule possessing negative and positive charges on the same molecule;
a water soluble solvent; and
optionally
a biocide; and
a pH adjuster;
wherein the composition has a pH of 2 to 12, preferably 3 to 10, more preferably 4 to 9, and most preferably 4.5 to 7.5.

The ceria-coated inorganic oxide particles include, but are not limited to, ceria-coated colloidal silica, ceria-coated high purity colloidal silica, ceria-coated alumina, ceria-coated titania, ceria-coated zirconia, or any other ceria-coated inorganic metal oxide particles.

The water soluble solvent includes but is not limited to deionized (DI) water, distilled water, and organic alcoholics.

The gelatin molecule functions as an oxide film removal rate boosting agent.

The gelatin molecule can be organic or inorganic and made either from natural sources or from synthetic chemistry with negative and positive charges bearing on the same molecule.

For example, gelatin made from animal skin, such as, cold water fish skin, porcine skin, and bovine skin is considered and used as the gelatin molecule in the STI CMP polishing compositions.

In another aspect, there is provided a method of chemical mechanical planarization (CMP) a substrate having at least one surface comprising a silicon dioxide film using the STI CMP polishing composition described above in Shallow Trench Isolation (STI) process.

In another aspect, there is provided a system of chemical mechanical polishing (CMP) a substrate having at least one surface comprising a silicon dioxide film using the STI CMP polishing composition described above in Shallow Trench Isolation (STI) process.

The polished oxide film can be a silicon dioxide film formed by Chemical vapor deposition (CVD), Plasma Enhance CVD (PECVD), or High Density Deposition CVD (HDP), or a spin on silicon dioxide film.

The substrate disclosed above can further comprises a silicon nitride surface.

DETAILED DESCRIPTION OF THE INVENTION

In the global planarization of patterned STI structures, quickly removal of oxide capping layer with high oxide film removal rates is a key factor to be considered. Therefore, it is important to have STI CMP polishing compositions which can provide high oxide film removal rates when used for removing oxide capping layers effectively.

This invention relates to the Chemical mechanical polishing (CMP) compositions for Shallow Trench Isolation (STI) CMP applications.

More specifically, the disclosed chemical mechanical polishing (CMP) composition for Shallow Trench Isolation (STI) CMP applications have a unique combination of using ceria-coated inorganic oxide abrasive particles and a suitable chemical additive as an oxide film removal rate boosting agent.

The suitable chemical additive includes but is not limited to a gelatin molecule possessing negative and the positive charges on the same molecule and is either made from natural sources, from synthetic chemistry, and combinations thereof.

The use of the gelatin molecule as the chemical additive in the invented STI CMP polishing composition provides the benefits of achieving high oxide film removal rates, which are very useful for VNAND, ILD, and STI CMP applications demanding high oxide film removal rates for high throughput device fabrications.

In one aspect, there is provided a STI CMP polishing composition comprises:
ceria-coated inorganic oxide particles;
a gelatin molecule possessing negative and positive charges on the same molecule;
a water soluble solvent; and optionally
a biocide; and
a pH adjuster;
wherein the composition has a pH of 2 to 12, preferably 3 to 10, more preferably 4 to 9, and most preferably 4.5 to 7.5.

The ceria-coated inorganic oxide particles include, but are not limited to, ceria-coated colloidal silica, ceria-coated high purity colloidal silica, ceria-coated alumina, ceria-coated titania, ceria-coated zirconia, or any other ceria-coated metal oxide particles.

The mean particles sizes (MPS) of these ceria-coated inorganic oxide particles in the disclosed invention herein are ranged from 10 nm to 1,000 nm, 20 nm to 500 nm, 30 nm to 400 nm, 50 nm to 250 nm, or 100 nm to 200 nm. MPS refers to diameter of the particles and is measured using dynamic light scattering (DLS) technology.

The concentration of these ceria-coated inorganic oxide particles ranges from 0.01 wt. % to 20 wt. %, from 0.02 wt. % to 10 wt. %, from 0.005 wt. % to 5 wt. %, or from 0.01 wt. % to 3 wt. %.

The preferred ceria-coated inorganic oxide particles are ceria-coated colloidal silica particles.

The gelatin chemical additives comprise gelatin molecules bearing the negative and the positive charged on the same molecule.

The gelatin molecule can be organic or inorganic and made either from natural sources or from synthetic chemistry with negative and positive charges bearing on the same molecule.

The gelatin molecule for example, comprises organic carboxylate functional groups which provide the negative charges and the protonated organic amino groups which provide the positive charges. In addition, the gelatin molecule can also contain the organic amide functional groups, 5-membered non-aromatic rings with one nitrogen atom as a hetero-atom.

For example, the organic gelatin molecule is made from animal skin, such as, cold water fish skin, porcine skin, and bovine skin.

Gelatin from cold water fish skin (G7041), bovine skin (G9381, G9382, G6650), and porcine skin (G1890) can be purchased from Sigma-Aldrich, St. Louis, MO As an example, the molecular structure of gelatin made from cold water fish skin is shown below:

The pH adjuster also includes a basic pH adjusting agent, such as sodium hydride, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The STI CMP composition contains 0 wt. % to 1 wt. %; 0.01 wt. % to 0.5 wt. %; or 0.1 wt. % to 0.25 wt. % of the pH adjuster.

In another aspect, there is provided a method of chemical mechanical planarization (CMP) a substrate having at least one surface comprising a silicon dioxide film using the STI CMP polishing composition described above in Shallow Trench Isolation (STI) process.

In another aspect, there is provided a system of chemical mechanical polishing (CMP) a substrate having at least one surface comprising a silicon dioxide film using the STI CMP polishing composition described above in Shallow Trench Isolation (STI) process.

The polished silicon dioxide film can be formed by Chemical vapor deposition (CVD) referred to as a CVD silicon dioxide film, Plasma Enhance CVD (PECVD) referred to as a PECVD silicon dioxide film, High Density Deposition CVD (HDP) referred to as a high density silicon dioxide film, or a spin on referred to as a spin on silicon dioxide film.

The substrate disclosed above can further comprises a silicon nitride surface.

The water-soluble solvent includes but is not limited to deionized (DI) water, distilled water, and alcoholic organic solvents.

The concentration of gelatin ranges from 0.0001 wt. % to 5 wt. %, 0.0005 wt. % to 2 wt. %, 0.001 wt. % to 1 wt. %, 0.002 wt. % to 0.5 wt. %, 0.0025 wt. % to 0.25 wt. %, or 0.003 wt. % to 0.1 wt. %.

The preferred water soluble solvent is DI water.

The STI CMP composition may contain the biocide from 0.0001 wt. % to 0.05 wt. %; from 0.0005 wt. % to 0.025 wt. %, or 0.001 wt. % to 0.01 wt. %.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one and 2-methyl-4-isothiazolin-3-one.

The STI CMP composition may contain the pH adjuster.

An acidic or basic pH adjuster can be used to adjust the STI polishing compositions to the optimized pH value.

The pH adjuster includes, but is not limited to nitric acid, hydrochloric acid, sulfuric acid, phosphoric acid, other inorganic or organic acids, and mixtures thereof.

In another aspect, there is provided a method of chemical mechanical planarization (CMP) a substrate having at least one surface comprising a silicon dioxide film using the STI CMP polishing composition described above in Shallow Trench Isolation (STI) process. The polished silicon dioxide film can be CVD silicon dioxide, PECVD silicon dioxide, High density silicon dioxide, or a Spin on silicon dioxide film.

The following non-limiting examples are presented to further illustrate the present invention.

CMP Methodology

In the examples presented below, CMP experiments were run using the procedures and experimental conditions given below.

Parameters

Å or A: angstrom(s)—a unit of length
BP: back pressure, in psi units
CMP: chemical mechanical planarization or chemical mechanical polishing CS: carrier speed DF: Down force: pressure applied during CMP, unit: psi min: minute(s)

ml: milliliter(s)

mV: millivolt(s)

psi: pounds per square inch

PS: platen rotational speed of polishing tool, in rpm (revolution(s) per minute)

SF: composition flow, ml/min

Wt. %: weight percentage (of a listed component)

HDP: high density plasma deposited TEOS

TEOS: tetraethyl orthosilicate

TEOS or HDP Removal Rates: Measured TEOS or HDP removal rate at a given down pressure. The down pressure of the CMP tool was 3.0 psi or 4.0 psi in the examples; listed below.

SiN Removal Rates: Measured SiN removal rate at a given down pressure. The down pressure of the CMP tool was 3.0 psi or 4.0 psi in the examples listed.

Polishing Experiments

The CMP tool that was used is a 200 mm Mirra, or 300 mm Reflexion manufactured by Applied Materials, 3050 Boweres Avenue, Santa Clara, California, 95054. An IC1000 pad supplied by DOW, Inc, 451 Bellevue Rd., Newark, DE 19713 was used on platen 1 for blanket and pattern wafer studies.

Polishing Pad: Polishing pad, IC1010, IC1000 and other pads were used during CMP, supplied by DOW, Inc.

The IC1010 pad supplied by DOW, Inc or other pad was broken in by conditioning the pad for 18 mins. At 7 lbs. down force on the conditioner. To qualify the tool settings and the pad break-in two tungsten monitors and two TEOS monitors were polished with Versum® STI2305 composition, supplied by Versum Materials Inc. at baseline conditions.

Ceria-coated Silica particles (with varied sizes) were supplied by JGC C&C Ltd. in Japan. The particles are made by the methods described in JP2013119131, JP2013133255, and WO2016159167; and the properties of the particles are also described in US20160200944A1; the disclosures are hereby incorporated by reference.

The MPS of the ceria-coated silica composite particles used in the examples were around 110 nm to around 125 nm. The ceria nano-particles coated on the surface of colloidal silica particles was >10 nm or >13 nm.

Gelatin made from cold water fish skin (G7041) was supplied by Sigma-Aldrich, St. Louis, MO In blanket wafer studies, oxide blanket wafers, and SiN blanket wafers were polished at baseline conditions. The tool baseline conditions were: table speed: 87 rpm, head speed: 93 rpm, membrane pressure; 3.0 psi DF or 4.0 psi DF, composition flow; 200 ml/min. The polishing pad used for testing was IC1010 pad which was supplied by Dow Chemicals.

Polishing experiments were conducted using PECVD or LECVD or HD TEOS wafers. These blanket wafers were purchased from Silicon Valley Microelectronics, 2985 Kifer Rd., Santa Clara, CA 95051.

Deionized water was used as the solvent in the compositions in the working examples.

The composition was used in polishing experiments on patterned wafers (MIT860) supplied by SWK Associates, Inc. 2920 Scott Blvd. Santa Clara, CA 95054). These wafers were measured on the Veeco VX300 profiler/AFM instrument. The 3 different sized pitch structures were used for oxide dishing measurement. The wafer was measured at center, middle, and edge die positions.

WORKING EXAMPLES

Example 1

In Example 1, the polishing compositions used for oxide polishing were shown in Table 1.

The reference sample was made by using 0.2 wt. % ceria-coated silica particles plus very low concentration ranging from 0.0001 wt. % to 0.05 wt. % of biocide, and DI water with finished pH at 5.35.

The polishing compositions were prepared by adding 0.0083 wt. % (or 83 ppm) gelatin made from cold water fish skin into the reference sample with final pH at 5.35.

The polishing step conditions used were Dow's IC1010 pad at 3.0 psi DF with table/head speed at 87/93 rpm and ex-situ conditioning.

The removal rates (RR at Å/min) for different films were tested. The effects of chemical additive gelatin made from cold water fish skin on the film removal rates were observed and listed in Table 1 and depicted in FIG. 1.

TABLE 1

Effects of Gelatin made from Cold Water Fish Skin on Film RR (Å /min.)

| Composition | TEOS RR (A/min.) | HDP RR (A/min.) | PECVD SiN RR (A/min.) |
|---|---|---|---|
| 0.2% Ceria-coated silica pH 5.35 | 2847 | 1994 | 375 |
| 0.2% Ceria-coated Silica + 0.0083% Gelatin from cold water fish skin, pH 5.35 | 4564 (+60%) | 4662 (+134%) | 1296 (+246%) |

Figure 1:
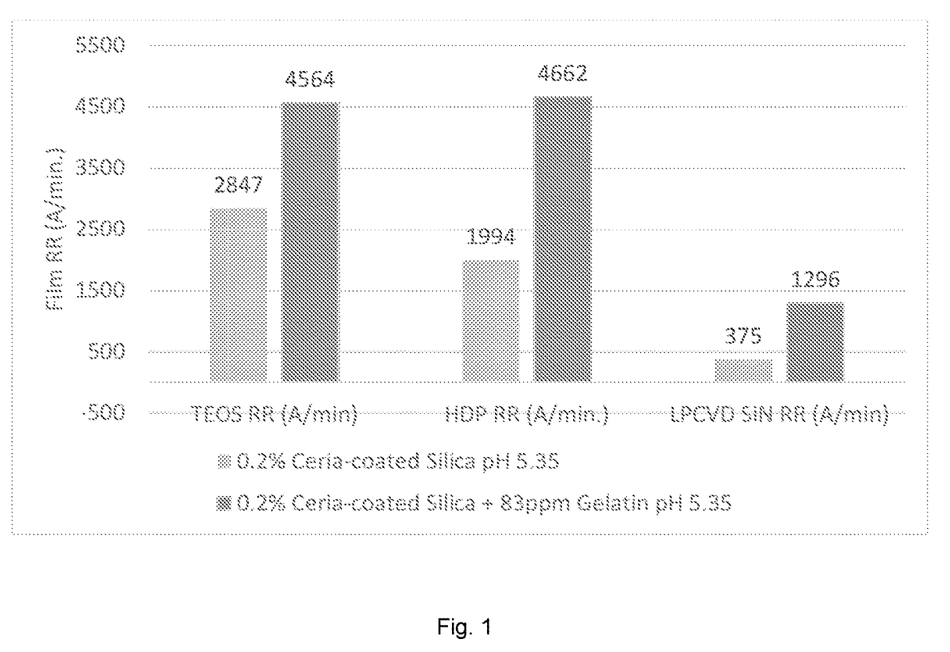
FIG. 1. Removal effect of using gelatin made from cold water fish skin on oxide film RR (Å/min.) at 3.0 psi down force (DF)

As the results shown in Table 1 and FIG. 1, the addition of 0.0083 wt. % gelatin made from cold water fish skin into the polishing composition effectively boosted TEOS, HDP and SiN film removal rates. TEOS film removal rate was increased by 60%, HDP film removal rate was increased by 134%, and PECVD film removal rate was increased by 246% respectively.

Example 2

In Example 2, the polishing compositions used for polishing were shown in Table 2.

The reference sample was made by using 1.0 wt. % ceria-coated silica particles plus very low concentration ranging from 0.0001 wt. % to 0.05 wt. % of biocide, and DI water.

The polishing compositions were prepared by adding different concentrations 0.0083 wt. % (83 ppm), 0.0415 wt.

% (415 ppm), or 0.083 wt. % (830 ppm), respectively of gelatin made from cold water fish skin into the reference sample.

The reference sample and polishing compositions had same pH values at around 7.0.

Figure 2:
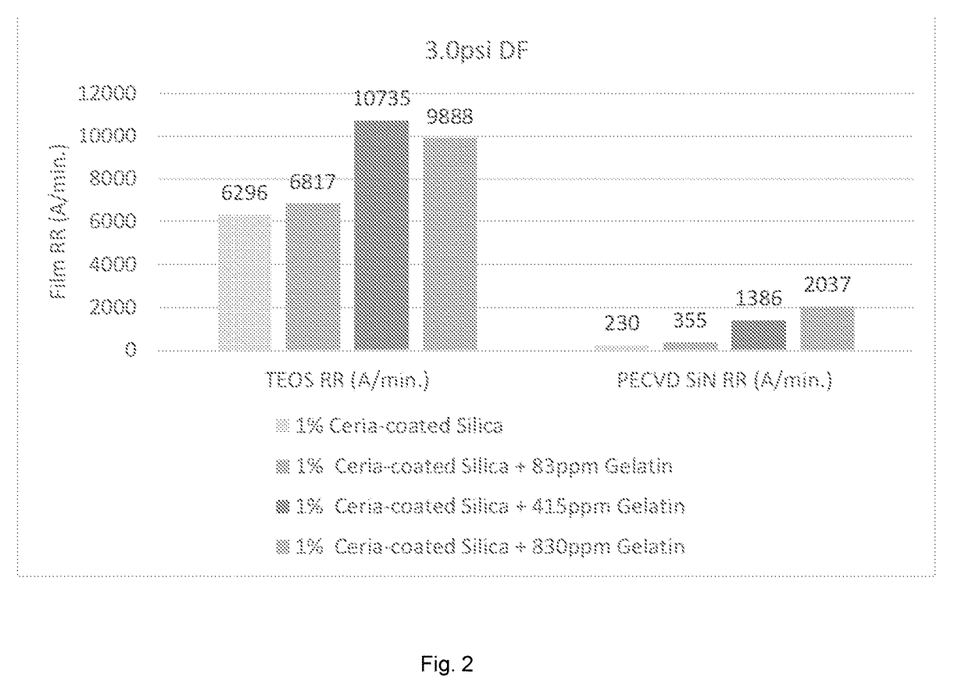
FIG. 2. Removal effect of using gelatin made from cold water fish skin on oxide film and SiN Film RR (Å/min.) at 3.0 psi down force (DF)

The effects of using gelatin made from cold water fish skin on the oxide and SiN film removal rates were tested at 3.0 psi DF, and the results were listed in Table 2 and depicted in FIG. 2.

TABLE 2

Effects of Gelatin made from Fish Skin on Oxide and SiN Film

| Compositions | TEOS RR (A/min.) | TEOS RR (A/min.) Change % | PECVD SiN RR (A/min.) | SiN RR (A/min.) Change % |
|---|---|---|---|---|
| 1% Ceria-coated Silica | 6296 | | 230 | |
| 1% Ceria-coated Silica + 83 ppm Gelatin | 6817 | (+) 8.3% | 355 | (+) 54.3% |
| 1% Ceria-coated Silica + 415 ppm Gelatin | 10735 | (+) 70.5% | 1386 | (+) 502.3% |
| 1% Ceria-coated Silica + 830 ppm Gelatin | 9888 | (+) 57% | 2037 | (+) 785.6% |

As the results shown in Table 2 and FIG. 2, the addition of gelatin made from cold water fish skin as the chemical additive at different concentrations at pH around 7.0 in the polishing compositions boosted both oxide and SiN film removal rates. With 0.0415 wt. % gelatin made from cold water fish skin as chemical additive, the TEOS film removal rate was boosted by >70% and SiN film removal rate was boosted by >500% at 3.0 spi DF.

Example 3

In Example 3, the reference sample and the polishing compositions were the same as used in Example 2.

Figure 3:
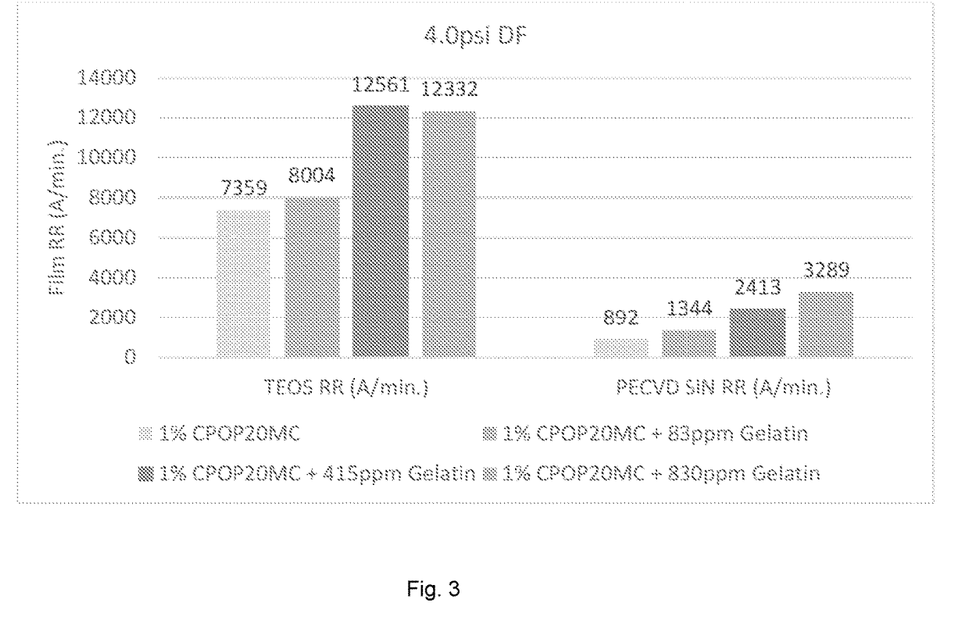
FIG. 3. Effects of Gelatin made from Fish Skin on Oxide and SiN Film RR (Å/min.) at 4.0 psi down force (DF)

The effects of gelatin made from cold water fish skin on the oxide and SiN film removal rates were tested at 4.0 psi DF, and the results were listed in Table 3 and depicted in FIG. 3.

TABLE 3

Effects of Gelatin made from Fish Skin on Oxide and SiN Film

| Compositions | TEOS RR (A/min.) | TEOS RR (A/min.) Change % | PECVD SiN RR (A/min.) | SiN RR (A/min.) Change % |
|---|---|---|---|---|
| 1% Ceria-coated Silica | 7359 | | 892 | |
| 1% Ceria-coated Silica + 83 ppm Gelatin | 8004 | (+) 9.5% | 1344 | (+) 50.7% |
| 1% Ceria-coated Silica + 415 ppm Gelatin | 12561 | (+) 70.7% | 2413 | (+) 170.5% |
| 1% Ceria-coated Silica + 830 ppm Gelatin | 12332 | (+) 67.6% | 3289 | (+) 268.7% |

As the results shown in Table 3 and FIG. 3, the addition of gelatin made from cold water fish skin as the chemical additive at different concentrations at pH around 7.0 in the polishing compositions boosted both oxide and SiN film removal rates. With 0.0415 wt. % gelatin made from cold water fish skin as chemical additive, the TEOS film removal rate was boosted by >70% and SiN film removal rate was boosted by >170% at 4.0 psi DF.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A chemical mechanical planarization polishing composition comprising:
   ceria-coated inorganic oxide particles selected from the group consisting of ceria-coated colloidal silica, ceria-coated alumina, ceria-coated titania, ceria-coated zirconia particles and combinations thereof;
   a gelatin molecule comprising organic carboxylate functional groups providing negative charges and protonated organic amino groups providing the positive charges on the same molecule;
   a water soluble solvent selected from the group consisting of deionized (DI) water, distilled water, and organic alcohol; and
   optionally: a biocide and a pH adjuster;
   wherein
   the ceria-coated inorganic oxide particles have a concentration of from 0.02 wt. % to 10 wt. %; and
   the composition has a pH value of 3 to 10.

2. The chemical mechanical planarization polishing composition of claim 1, wherein the gelatin molecule further comprises organic amide functional groups, and 5-membered non-aromatic rings with one nitrogen atom as a hetero-atom.

3. The chemical mechanical planarization polishing composition of claim 1, wherein the gelatin molecule is an organic gelatin molecule made from an animal skin selected from the group consisting of cold water fish skin, porcine skin, bovine skin, and combinations thereof; wherein the gelatin molecule has a concentration of 0.0001 wt. % to 5 wt. %.

4. The chemical mechanical polishing composition of claim 1, wherein the gelatin molecule has a molecular structure of:

5. The chemical mechanical planarization polishing composition of claim 1, wherein the biocide having an active ingredient of 5-chloro-2-methyl-4-isothiazolin-3-one or 2-methyl-4-isothiazolin-3-one; and the biocide having a concentration of from 0.0001 wt. % to 0.05 wt. %;

the pH adjuster selected from the group consisting of nitric acid, hydrochloric acid, sulfuric acid, phosphoric acid, other inorganic or organic acids, and mixtures thereof for acidic pH conditions; or selected from the group consisting of sodium hydride, potassium hydroxide, ammonium hydroxide, organic quaternary ammonium hydroxide compounds, organic amines, and combinations thereof for alkaline pH conditions; and the pH adjuster having a concentration of from 0 wt. % to 1 wt. %.

6. The chemical mechanical planarization polishing composition of claim 1, wherein the composition comprises ceria-coated colloidal silica particles as the ceria-coated inorganic oxide particles, the gelatin molecule made from animal skin selected from the group consisting of cold water fish skin, porcine skin, bovine skin, and combinations thereof; and the pH value of the chemical mechanical planarization polishing composition is 4 to 9.

* * * * *